US010249077B2

(12) United States Patent
Laurent et al.

(10) Patent No.: US 10,249,077 B2
(45) Date of Patent: Apr. 2, 2019

(54) RENDERING THE GLOBAL ILLUMINATION OF A 3D SCENE

(71) Applicant: DASSAULT SYSTEMES, Velizy Villacoublay (FR)

(72) Inventors: Gilles Laurent, Chatillon (FR); Cyril Delalandre, Chatillon (FR); Grégoire De La Riviere, Bordeaux (FR); Tamy Boubekeur, Paris (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 188 days.

(21) Appl. No.: 15/442,180

(22) Filed: Feb. 24, 2017

(65) Prior Publication Data

US 2017/0249778 A1    Aug. 31, 2017

(30) Foreign Application Priority Data

Feb. 25, 2016    (EP) .................................... 16305221

(51) Int. Cl.
| | | |
|---|---|---|
| G06T 15/50 | (2011.01) | |
| G06T 15/00 | (2011.01) | |
| G06T 15/80 | (2011.01) | |
| G06T 17/20 | (2006.01) | |
| G06F 17/50 | (2006.01) | |

(52) U.S. Cl.
CPC .......... G06T 15/506 (2013.01); G06T 15/005 (2013.01); G06T 15/80 (2013.01); G06T 17/20 (2013.01); G06F 17/50 (2013.01)

(58) Field of Classification Search
None
See application file for complete search history.

(56) References Cited

U.S. PATENT DOCUMENTS 6,747,659 B2 *  6/2004  Deering .................. G06T 15/80
345/581

OTHER PUBLICATIONS

Gilles Laurent, Cyril Delalandre, Grégoire de La Rivière, Tamy Boubekeur, "Forward Light Cuts: A Scalable Approach to Real-Time Global Illumination", Jun. 24, 2016, Eurographics Symposium on Rendering 2016, vol. 35, No. 4, pp. 79-88.*

Tobias Ritschel, Elmar Eisemann, Inwoo Ha, James D. K. Kim, and Hans-Peter Seidel, "Making Imperfect Shadow Maps View-Adaptive: High-Quality Global Illumination in Large Dynamic Scenes", 2011, Blackwell Publishing, Computer Graphics Forum, vol. 30, No. 8, pp. 2258-2269.*

(Continued)

*Primary Examiner* — Robert Bader
(74) *Attorney, Agent, or Firm* — Oblon, McClelland, Maier & Neustadt, L.L.P.

(57) ABSTRACT

The invention notably relates to a computer-implemented method for rendering the global illumination of a three-dimensional scene. The method comprises providing a 3D scene that comprises of a set of triangles and one or more direct light sources, determining that each triangle of the set has an area that is below a threshold, assigning to each triangle of the set a radius of influence using a probability law, obtaining a subset of triangles by filtering out the triangles according to their radius of influence, rendering the three-dimensional scene by lighting its set of triangles, the triangle of the subset of triangles being used as indirect light sources according to their radius of influence.

18 Claims, 7 Drawing Sheets

(56) References Cited

OTHER PUBLICATIONS

Carsten Dachsbacher, Marc Stamminger, "Reflective Shadow Maps", Apr. 6, 2005, ACM, I3D '05 Proceedings of the 2005 symposium on Interactive 3D graphics and games, pp. 203-208, 231.*

James T. Kajiya; "The Rendering Equation"; ACM SIGGRAPH Computer Graphics; vol. 20, pp. 143-150.

Bruce Walter, et al.; "Lightcuts: A Scalable Approach to Illumination"; ACM Transactions on Graphics (TOG); vol. 24, 10 pages.

Martin Mittring, et al.; "Finding Next Gen—CryEngine 2"; ACM SIGGRAPH 2007 Courses, 25 pages.

A. Keller, "Instant Radiosity"; Proceedings of the 24$^{th}$ Annual Conference on Computer Graphics and Interactive Techniques; Press/Addison-Wesley Publishing Co.; 40 pages.

Oliver Nalbach, et al.; "Deep Screen Space"; Proceedings of the 18$^{th}$ Meeting of the ACM SIGGRAPH Symposium on Interactive 3D Graphics and Games, ACM; 2014; 7 pages.

Takafumi Saito; et al.; "Comprehensible Rendering of 3-D Shapes"; ACM SIGGRAPH Computer Graphics; vol. 24; ACM; 10 pages.

Alexander Keller, et al.; "Interleaved Sampling"; Springer; 9 pages.

Tobias Ritschel, et al.; "The State of the Art in interactive Global Illumination"; Computer Graphics Forum; vol. 31, No. 1; Feb. 1, 2012; 26 pages; XP055202642; ISSN: 0167-7055, DOI: 10.1111/j.1467-8659.2012.02093.x *abstract*.

Yusuke Tokuyoshi, "Virtual Spherical Gaussian Lights for Real-time Glossy Indirect Illumination", Pacific Graphics 2015; Jan. 1, 2015, XP055288245, Retrieved from the Internet URL:http//www.ip.square-enix.com/info/library/pdf/Virtual Spherical Gaussian Lights for Real-time Glossy Indirect Illumination (PG2015).pdf *abstract*.

H. Dammertz et al.; "Progressive Point-Light-Based Global Illumination"; Computer Graphics Forum, vol. 29, No. 8; Dec. 1, 2010, 11 pgs; XP055288241, GB; ISSN: 0167-7055; DOI: 10.1111/j.1467-8659.2010.01786.x *abstract*.

Extended Search Report issued Jul. 26, 2016, in European Patent Application No. 16305221.0-1502.

* cited by examiner

RENDERING THE GLOBAL ILLUMINATION OF A 3D SCENE

CROSS-REFERENCE TO RELATED APPLICATION

This application claims priority under 35 U.S.C. § 119 or 365 to European Application No. 16305221.0, filed Feb. 25, 2016. The entire contents of the above application(s) are incorporated herein by reference.

FIELD OF THE INVENTION

The invention relates to the field of computer programs and systems, and more specifically to a method, system and program for rendering the global illumination of a three-dimensional scene in the context of large models such as the complex scenes usually encountered in CAD application scenarios.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Light transport simulation is an important component of realistic image synthesis. The body of research work related to this phenomenon is referred as "global illumination" and, despite its well-known physics laws, remains a challenging problem due to its high computational cost, with even more critical consequences for real-time scenarios. Hidden behind the recursive nature of the rendering equation as discussed in KAJIYA, J. T. 1986. *The rendering equation. In ACM Siggraph Computer Graphics*, vol. 20, ACM, 143-150, global illumination simulation has been addressed in a large number of approaches, for the high degree of realism it brings to special effects, previsualization, animated movie production and video games.

Currently, two lines of research can be distinguished. The first one is "interactive rendering" which aims at quickly providing a visually convincing approximation of global illumination. The second one is "offline rendering" which targets a solution which is as close as possible to physics.

Among the various strategies that can be used to achieve real-time performance for "interactive rendering", exploiting the low frequency behavior of distant incoming radiance has proven to be effective. For instance, hierarchical radiance caching methods discussed in WALTER, B., FERNANDEZ, S., ARBREE, A., BALA, K., DONIKIAN, M., AND GREENBERG, D. P. 2005. *Lightcuts: a scalable approach to illumination. In ACM Transactions on Graphics* (TOG), vol. 24, ACM, 1098-1107 exploit this property by computing a tree over the geometry of the scene, which stores a multiscale radiance function. Assuming indirect lighting being modelled by virtual point lights (VPLs) located on the scene surfaces, every internal node of this tree provides a representative radiance response of its related subtree and is used as a substitute to it as soon as the radiance is evaluated from a distant location. The set of nodes used to evaluate the incoming radiance at a given point (e.g. unprojected image pixel) is called a light cut, since gathering a node induces discarding its children.

A number of high-performance implementations of light cut gathering processes have been proposed, but most of them rely on precomputing and maintaining the tree, which can have a significant memory and computational cost.

Mittring et al. (MITTRING, M. 2007. *Finding next gen: Cryengine 2. In ACM SIGGRAPH 2007 courses*, ACM, 97-121) introduced an ambient occlusion approximation method using the depth-buffer as an economic, random-accessible substitute to the actual (potentially large) geometry of the scene, and parameterizing the light cache in screen-space. A large variety of other methods exploits screen-space approximations to lower the computational complexity of some lighting effects. However, despite their real-time and dynamic performances, such approaches rely on depth peeling and multiple views rendering to account for the full geometry of the scene i.e., beyond the first depth layer and outside the view frustum, which quickly impacts negatively their native speed.

In contrast to screen-space approaches, solving for indirect illumination in object-space avoids such view-dependent artifacts, at the cost of less GPU-friendly light caches. For instance, Instant Radiosity (IR) methods as discussed in KELLER, A. 1997. *Instant radiosity. In Proceedings of the 24th annual conference on Computer graphics and interactive techniques*, ACM Press/Addison-Wesley Publishing Co., 49-56 work with a set of secondary point light sources, called Virtual Point Lights (or VPLs), directly generated on the geometry illuminated by the primary sources. Thus, a VPLs set acts as a discrete representation of the scene's indirect lighting and allows to reduce computations drastically when approximating light bounces. However, scaling up to massive data requires huge amounts of VPLs. This is challenging as both generation and shading costs of so many VPLs is prohibitive in dynamic scenes.

Finally, the Deep Screen Space (DSS) approach discussed in NALBACH, O., RITSCHEL, T, AND SEIDEL, H.-P. 2014. *Deep screen space. In Proceedings of the 18th meeting of the ACM SIGGRAPH Symposium on Interactive 3D Graphics and Games*, ACM, 79-86. 2014 proposes to exploit the advantages of both screen-space and object-space radiance caching. The same way as object-space strategies, this method generates on-surface VPLs, even on occluded geometry that may still impact the image; and similarly to screen-space approaches, it benefits from a native GPU support, with the tessellator unit—instead of the rasterizer—being used as a surface sampler to generate the VPLs. Still, although DSS can successfully be used for rendering small to medium size scenes, it cannot cope with larger ones, where the real-time constraints imposes decimating geometry rather than refining it.

Within this context, there is still a need for an improved method rendering the global illumination of a three-dimensional scene.

SUMMARY OF THE INVENTION

It is therefore provided a computer-implemented method for rendering the global illumination of a three-dimensional scene. The method comprises:
  providing a three-dimensional scene that comprises of a set $\mathcal{L}$ of triangles and one or more direct light sources;
  determining that each triangle $t_i$ of the set has an area that is below a threshold $S_o$;
  assigning to each triangle of the set a radius of influence using a probability law;
  obtaining a subset of triangles $\mathcal{L}*$ by filtering out the triangles according to their radius of influence;
  rendering the three-dimensional scene by lighting its set of triangles, the triangle of the subset of triangles $\mathcal{L}*$ being used as indirect light sources according to their radius of influence.

The method may comprise one or more of the following:
  determining that each triangle of the set has an area that is below the threshold comprises partitioning the set of triangles $\mathcal{L}$ into a first set of triangles, wherein each triangle of the first set has an area that is below the threshold; a second set of triangles, wherein each triangle of the second set has an area that is above the threshold; and tessellating each triangle of the second set into a third set of triangles, wherein each triangle of the third set has an area that is below the threshold as a result of the tessellation; and wherein assigning to each triangle of the set a radius of influence using a probability law comprises assigning to each triangle of the first and the third sets a radius of influence using a probability law; and obtaining a subset of triangles comprises obtaining a subset of triangles by filtering out the triangles of the first and third sets according to their radius of influence;
  comprising, after determining that each triangle of the set has an area that is below a threshold: randomly partitioning the set of triangles into N+2 subsets of triangles according to the probability law; discarding one of the N+2 subsets of triangles that comprises triangles that are determined as having a low contribution to the rendering of the 3D scene, the remaining N+1 subsets comprising non-discarded triangles;
  the remaining subsets $\mathcal{L}*$ of the N+2 subsets of triangles comprise triangles $t_i$ of the set such that $$\forall t_i \in \mathcal{L}, P(t_i \in \mathcal{L}*) = \frac{\mathcal{A}(t_i)}{S_0},$$

wherein $A(t_i)$ is the surface area of the triangle $t_i$ and $S_o$ is the threshold;
  each triangle of the remaining subsets $\mathcal{L}*$ is dispatched (S520) in one of the remaining subsets $\mathcal{L}^k$ according to a probability for a triangle to lie in a subset $\mathcal{L}^k$ defined by:

$$P(t_i \in \mathcal{L}^k) = \begin{cases} \frac{\mathcal{A}(t_i)}{S_N}, & \text{if } k = N \\ \frac{\mathcal{A}(t_i)}{S_N} - \frac{\mathcal{A}(t_i)}{S_{k+1}}, & \text{if } 0 \le k < N \end{cases}$$

wherein the value of $S_k$ increases for when k increases;
  $S_k$ is set such that $S_k = S_o \mu^k$, where $\mu > 1$ and the value of $\mu$ is a real number comprised between [1;5];
  $S_k$ is set such that $S_k = S_o \mu^k$, where the value of $\mu$ is defined by $$\mu > \sqrt[N]{4 \frac{\mathcal{R}_{scene}^2}{S_o}}$$

with $\mathcal{R}_{scene}$ that is the radius of the three-dimensional scene;
  after that each triangle of the remaining subsets $\mathcal{L}*$ has been dispatched: computing a single virtual point light for each triangle of the remaining subsets $\mathcal{L}*$; and wherein assigning to each triangle of the set a radius of influence using a probability law further comprises computing an outgoing radiance for the virtual point light of each triangle of the remaining subsets $\mathcal{L}*$, the computation being performed according to the subset in which the triangle has been dispatched;
  computing an outgoing radiance for the virtual point light of each triangle comprises computing a family of nested balls $\mathcal{B}_h(t_i)$ representing the set of points in the three-dimensional scene for which the contribution of the virtual point lights is significant;
  computing, for each remaining subset of the N+2 subsets, a support function $f^k(t_i, x)$ such that the set of support functions $(f^k)_k$ over the remaining subsets form a partition of unity that is constant over a frontier of a $\mathcal{B}_h(t_i)$ of the family of nested balls;
  a base function of the set of support functions $(f^k)_k$ is a B-spline;
  $\mathcal{B}_h(t_i)$ is defined by $$\mathcal{B}_h(t_i) = \left\{ x \in \mathbb{R}^3 \text{ s.t. } \frac{\|x - y_i\|}{(\vec{n_x}, \vec{xy_i})^+} \le D(h) = \frac{1}{\pi}\sqrt{\frac{\rho_x \rho_i E(t_i)}{h}} \right\},$$

wherein x is a point of the three-dimensional scene with normal $\vec{n}_x$, $y_i$ is the point on which the virtual point light is centered on the triangle $t_i$, $\rho_x$ is albedo at point x, $\rho_i$ is albedo at point $y_i$, $E(t_i)$ is a direct irradiance falling to the triangle $t_i$;
  at the rendering step, the set of support functions $(f^k)_k$ is used for carrying out splatting operations when rendering a sphere of a $\mathcal{B}_h(t_i)$ of a family of nested balls;
  the threshold $S_o$ is defined by $$S_o = 4\pi \frac{D_{near}^2}{N_{Avg}},$$

wherein $N_{Avg}$ is an average number of virtual point lights, $D_{near}$ is a minimal distance between pixels of the 3D scene and VPLs;
  before determining that each triangle $t_i$ of the set has an area that is below a threshold $S_o$: generating (S20) a single random integer for each vertex of triangle $t_i$ of the set;

wherein computing a single random integer for each vertex of triangle further comprises for each sub-vertex of a triangle of the third set, determining a barycentric coordinate of the sub-vertex; using the barycentric coordinate to fetch (S210) a random value in a noise texture; using the fetched random value to generate (S220) the single random integer of the said each sub-vertex of a triangle of the third set.

It is further provided a computer program comprising instructions for performing the method. It is further provided a graphic library computer program comprising instructions for performing the method.

It is further provided a computer readable storage medium having recorded thereon the graphic library computer program.

It is further provided a system comprising a processor coupled to a memory and a graphical card with a graphic processing unit, the memory having recorded thereon the computer program.

The graphical card of the system may comprise a geometry shader unit for determining that each triangle $t_i$ of the set has an area that is below a threshold $S_o$; and a tessellation unit for tessellating triangles $t_i$ of the set; wherein the computer program recorded on the memory is adapted to configure the tessellation unit for performing the generation of the single random integers.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
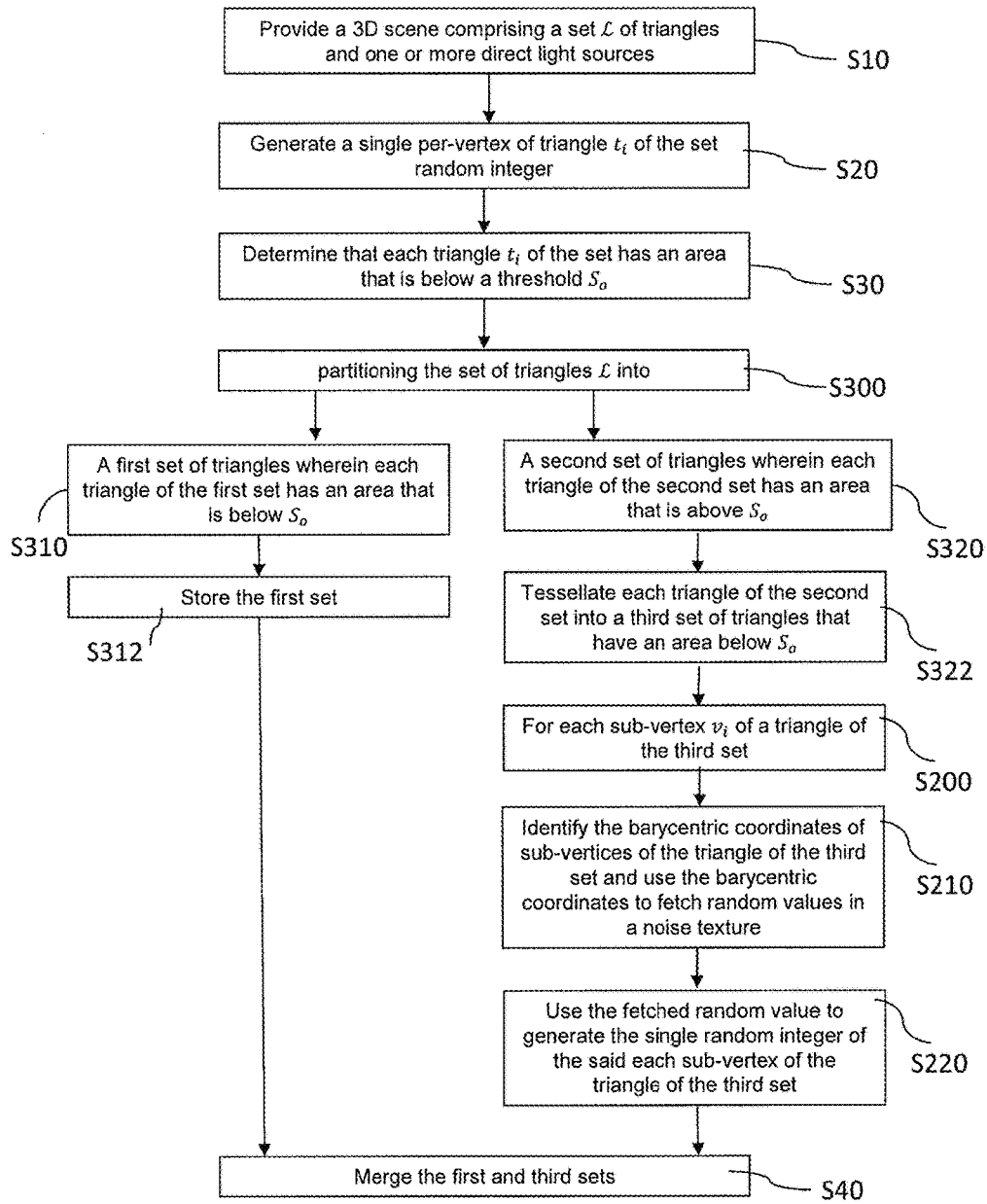
FIGS. 1 and 2 show a flowchart of an example of the method.
Figure 2:
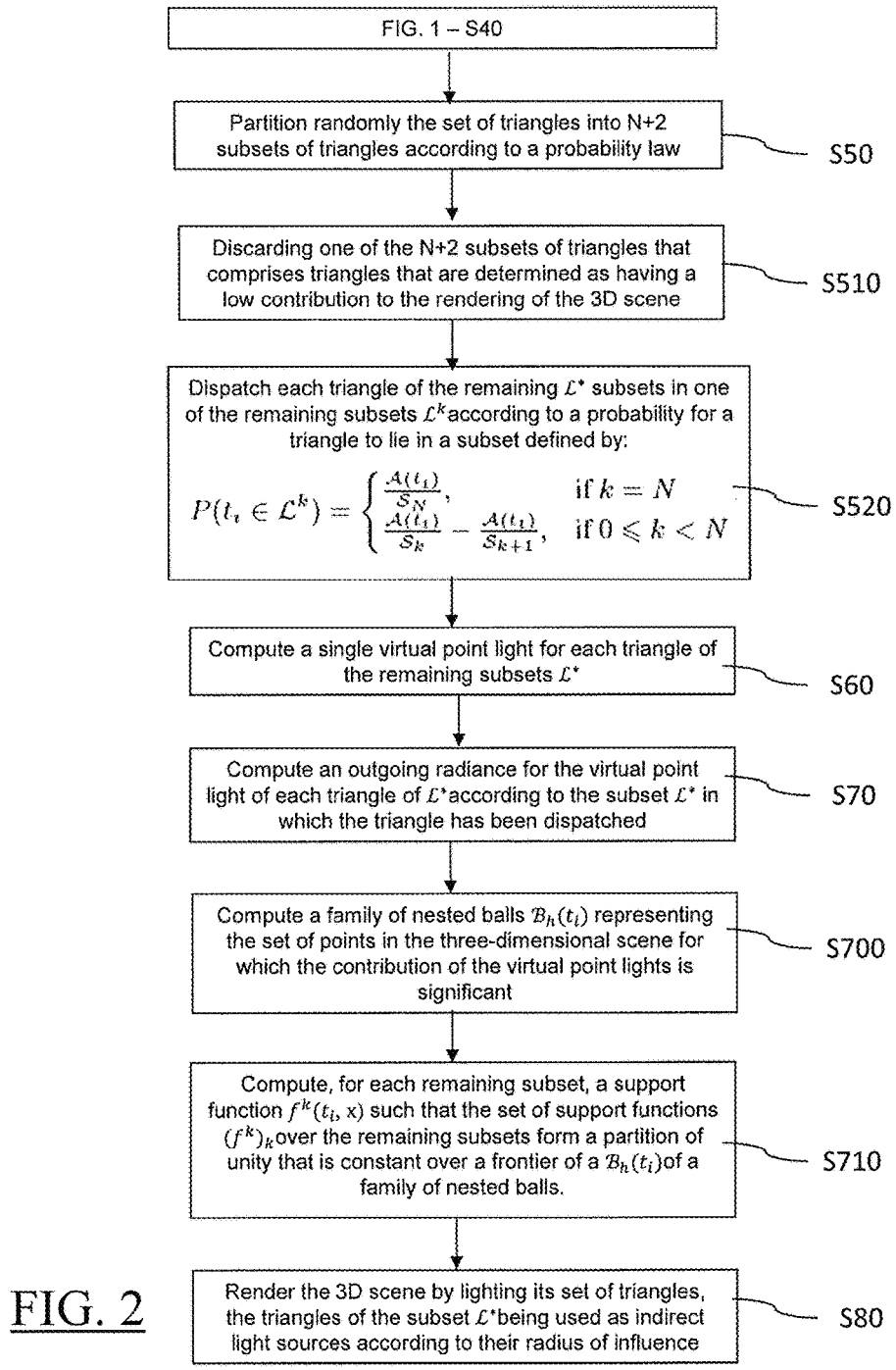

With reference to the flowcharts of FIGS. 1 and 2, it is proposed a computer-implemented method for rendering the global illumination of a three-dimensional scene. The method comprises providing a three-dimensional scene that comprises of a set $\mathcal{L}$ of triangles and one or more direct light sources. Then, one determines that each triangle $t_i$ of the set has an area that is below a threshold $S_o$. Next, a radius of influence is assigned to each triangle of the set using a probability law. Then, a subset of triangles $\mathcal{L}^*$ is obtained by filtering out the triangles according to their radius of influence. Next, the three-dimensional scene is rendered by lighting its set of triangles, the triangle of the subset of triangles $\mathcal{L}^*$ being used as indirect light sources according to their radius of influence.

Such a method improves the rendering in real-time of the global illumination of a three-dimensional scene. Indeed, a multiscale representation of lighting is generated—VPLs are generated based on a stochastic decimation process of the input triangle set—and forwardly (i.e. exploring light space from sources to sensor)—compute the bounded influence region of each of them as if they were selected in a cut. The present exploits both the geometry shader and the tessellator unit of a graphic card to build, on a per frame basis, the set of virtual point lights (VPLs) that approximate indirect lighting. The present invention proposes a diffuse graphic pipeline for illumination which can both refine and simplify the set of geometry driven VPLs in a two-pass strategy. Exploiting both the tessellator unit and the geometry shader to adjust the resolution of an object space radiance cache in the context of scenes with a massive number of triangles. The present invention does not imply any complex preprocessing nor requires carrying complex data structures over frames. Real-time performance is reached by using a multiscale representation of the light field, and is fully dynamic and does not resort to any tree structure, nor imposes to maintain any data structure among frames. It is compatible with fully dynamic scenes, including light, view point and geometry animations. Last, but not the least, in terms of integration, the present invention naturally fits standard modern graphics pipelines and does not make any strong assumption on the complementary rendering techniques employed by the host application.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of the method is to perform the method with a system adapted for this purpose. The system may comprise a processor coupled to a memory and a graphical card with a graphic processing unit, the memory having recorded thereon a computer program comprising instructions for performing the method. The computer program can be a graphic library computer program. The memory may also store a database. The memory is any hardware adapted for such storage, possibly comprising several physical distinct parts (e.g. one for the program, and possibly one for the database). The database may store the 3D scene to be rendered, e.g. the database stores the set of triangles of the scene.

Figure 12:
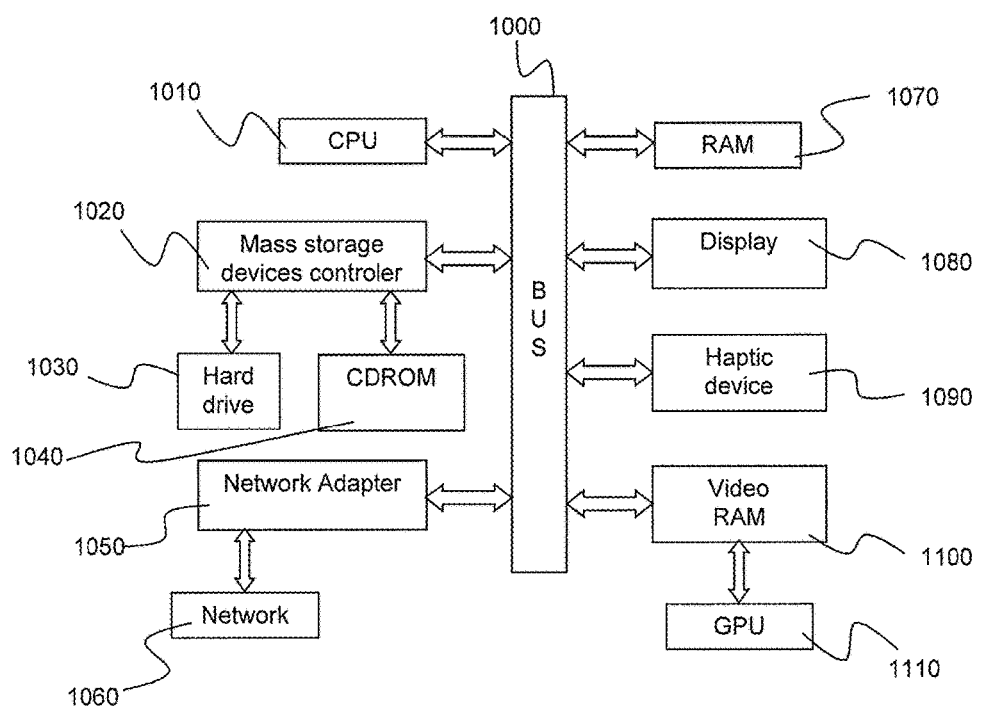
FIG. 12 shows an example of a system for performing the method.

FIG. 12 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

Figure 5:
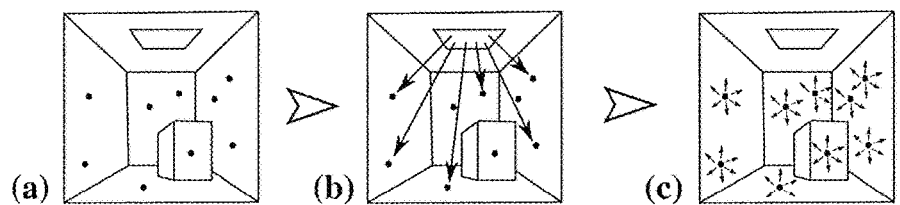
FIG. 5 shows an example of indirect illumination pipeline of the invention.

As it will discussed in greater details below, the present invention uses Virtual Point Lights (VPLs), i.e. a set of points for which a certain lighting is cached. The cached lighting may be direct lighting. VPLs are used to approximate indirect light bounces. FIG. 5 shows an example of VPL based pipeline, as known in the art. A VPL pipeline is typically composed of three main stages that are (a) VPLs generation, (b) indirect light caching and (c) lighting with VPLs.

The present invention notably focusses on (a) VPLs generation and (c) their usage during lighting. FIG. 1 shows an example of the generation of triangles for which VPLs are generated:
  at preprocessing time, the computing of a single per-vertex random integer which will be used at rendering time to generate per triangle random numbers consistently, even under dynamic geometry transformations; an example of the creation of a subset of triangles from the raw geometries is discussed. Notably the use of a regular pipeline and divergent pipeline is presented; large triangles—that are called "divergent" in the present invention—are not well sampled by the aforementioned strategy and may introduce important lighting artifacts in the final image; consequently, divergent triangle are routed through a tessellation unit, where they are subdivided until reaching the proper resolution;
  an example of the discard of triangles of the raw data, e.g. in order to greatly reduce the number of managed triangles while optimizing the amount of sampling information, a special set—mainly composed of small triangles—is completely discarded.

FIG. 2 shows an example of the generation of the VPLs, wherein the full set of triangles generated from the raw data (FIG. 1) is randomly partitioned according to a probabilistic law. For each triangle, a VPL is generated and its outgoing radiance is computed based solely on its related partition ($\mathcal{L}^0, \ldots \mathcal{L}^N$). Finally, indirect illumination is splatted in a typical deferred shading process, with the splatted function supports depending on the VPL partition, reserving powerful VPLs to carry on distant lighting using crescent-shaped support.

Referring back to FIG. 1, a first aspect of the present invention is now discussed, which is the generation of triangles from raw data for which VPLs are generated. At step S10, a 3D scene is provided. The 3D scene comprises a set $\mathcal{L}$ of triangles and one or more direct light sources. Providing means that the raw data (the set $\mathcal{L}$ of triangles of the 3D scene) can be accessed by the system and/or the program implementing the method of the invention. Typically, the 3D scene can be loaded in a Render Engine that is a framework that generates images to be displayed upon application's request, as known in the art. For instance, a CAD application of CAD system provides to the Render Engine a 3D scene of 3D modeled objects as input and the Render Engine draws the 3D scene to the screen with the use of one or more Graphic Cards of the CAD system. The triangles of the 3D scene form a mesh, e.g. modeled objects of the 3D scene are represented by interconnected triangles, as known in the art.

Then, at step S20, a single random integer is generated for each vertex of each triangle of the set $\mathcal{L}$. As a result, a per-vertex uint32 attribute—v_rand is added. This attribute is initialized when loading the mesh with random values uniformly chosen between, but is not limited to this range, 0 and $2^{32}$, or even between 0 and $2^{64}$. It is to be understood that this step can be performed as known in the art.

Figure 3:
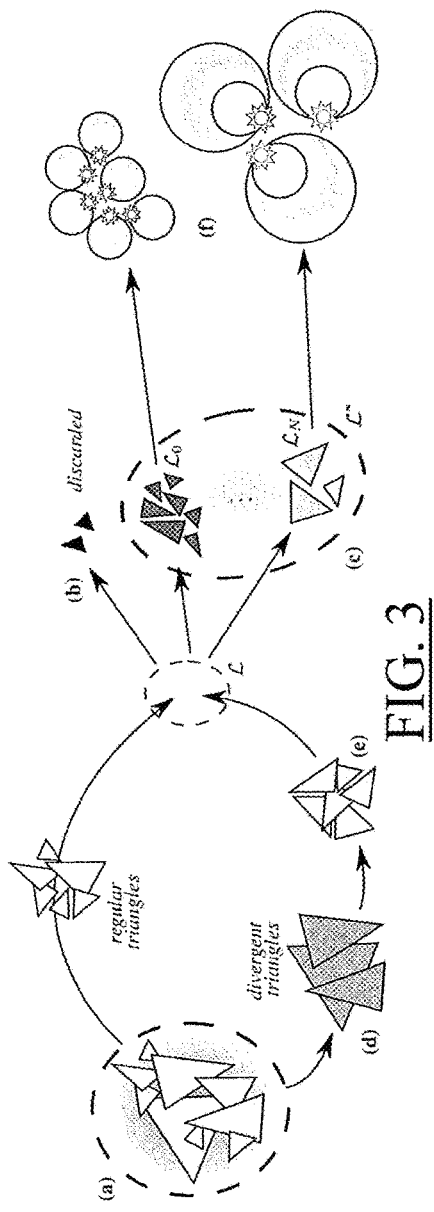
FIG. 3 shows an example of the method.

The steps S10 and S20 are noted (a) on FIG. 3.

Then, at step S30, it is determined that each triangle $t_i$ of the set has an area that is below a threshold $S_o$. Depending on the result of the determination, the raw data is split (or not) into regular and divergent triangles of the set, wherein divergent triangles are triangles with an area greater than the threshold $S_o$ that are subdivided such that every new triangle may be considered as regular as illustrated by (d) and (e) on FIG. 3; Regular triangles are triangles with an area smaller or equal to the threshold $S_o$. Steps S310-S312 discuss the regular pipeline of the regular triangles, and steps S320-S322 discussed the divergent pipeline.

Regular triangles are distinguished from divergent ones, i.e. the set of triangles $t_i$ with surface area $\mathcal{A}(t_i)$ greater that a certain threshold $S_o$. This threshold can be set such that (equation 1)

$$S_o = 4\pi \frac{D_{near}^2}{N_{Avg}},$$

which is a heuristic aiming at approximately lighting pixels with $N_{Avg}$ VPLs at least $D_{near}$ far from them. $D_{near}$ is a variable that provides a minimal distance between the pixels and the VPLs. $N_{Avg}$ is a number of VPLs on the 3D scene. Let $R_{scene}$ be the scene radius, set $D_{near}$ can be set $D_{near}=0.2\times R_{scene}$ and $N_{Avg}$ is preferably set between 64 and 1024 depending on the desired quality/speed tradeoff. It is to be understood that the range of value of $N_{Avg}$ may vary and that the number of VPLs can be higher depending on the computing resources of the system performing the rendering. The diameter of the scene is set $Diam_{scene}=2\times R_{scene}$ and the $Diam_{scene}$ is the maximal distance between two points of the scene.

Hence, at step S300, the set of triangles $t_i$ is partitioned in to a first set of triangles (S310) with an area smaller or equal to $S_o$, and a second set of triangles (S320) wherein each triangle of the second set has an area that is above $S_o$. It is to be understood that the first set might comprise the triangles smaller to $S_o$ and the second set might comprise the triangles equal or above $S_o$.

At step S312, the triangles of the first set a stored, e.g. on a cache memory.

At step S322, the triangles of the second set are tessellated into a third set of triangles. The tessellation is performed as known in the art. The tessellated triangles have an area that is smaller or equal to $S_o$: each triangle of the third set has an area that is below the threshold as a result of the tessellation.

Now, the raw data comprises two set of triangles. Triangles of both sets have an area that is smaller or equal to $S_o$: the difference between both sets is that each vertex of each triangle of the first set is associated with a single random integer, which is not the case for the triangles of the second set because the tessellation creates new triangles for which one or more vertices do not have a single random integer previously generated. In the example of FIG. 1, the single random integer has been generated and associated to the raw data. It is to be understood that single random integer could be generated and associated at a later stage, for instance while the first and second set are being determined; or even after the partitioning of the raw data have been performed. For example, once the first set has been stored, the single random integers might be generated for the vertices of the triangles of the first set.

Steps S200-S220 provide an example for generating a single random integer for each vertex of each triangle of the second set. Preferably, these steps are carried out while tessellating the triangles of the second set: for each newly tessellated triangle of the second set (S320), the steps S200 to S220 are performed. Alternatively, they can be performed after the third set have been build. Here, the steps S200-S220 are discussed in the case the generation is performed each time a triangle of the second set is tessellated.

Figure 9:
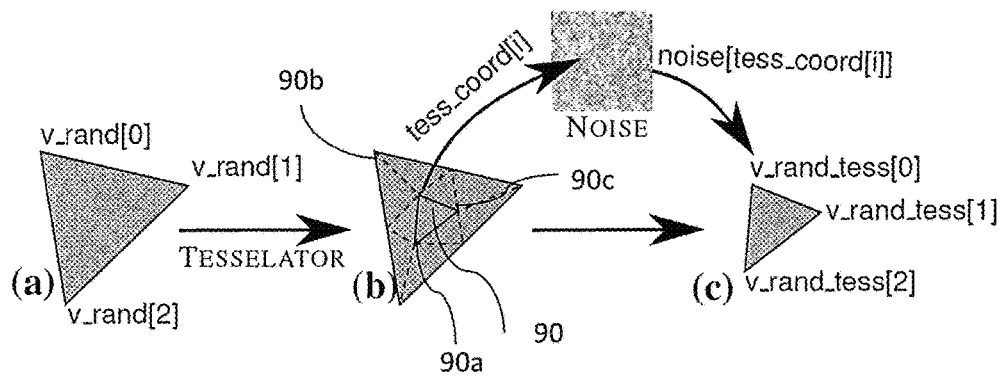
FIG. 9 shows an example of generation of per-triangle uniform random values.

At step S200, one determines each sub-vertex of a triangle of the third set. As illustrated on FIG. 9-(a), each vertex of the triangle of the second set comprises a uint32 attribute— v_rand. In FIG. 9-(b), the sub-vertices 90a, 90b, 90c of the triangle 90 are obtained, being understood that the triangle 90 is one of the new ten triangles obtained from the triangle of FIG. 9-(a).

Then, at step S210, one identifies the barycentric coordinates tess_coord[i] of the said each sub-vertex of the triangle of the third set. The barycentric coordinates are computed during the tessellation of the triangle of the second set from which the said each sub-vertex of a triangle of the third set was obtained. A random value is then fetched in a noise texture by using the barycentric coordinates tess_coord[i]. More precisely, for each tess_coord[i], a random value is fetched. The fetching is performed as known in the art: a texture can be contemplated as a bi-dimensional table where each cell of the table stores a value, for instance the values are 32 bits integers. When a random value is fetched, one of the cell is read, the cell been reached in the table by use of the coordinate tess_coord[i]. The noise texture is in general precomputed, e.g. at the time the rendering of a 3D scene is requested. The noise texture is a table of a given size, for instance 1024×1024.

Next, at step S220, the fetched random value is used to generate the single random integer of the said each sub-vertex of a triangle of the third set. As illustrated on FIG. 9-(c), each vertex of the triangle 90 is associated with a random value v_rand_tess[1] generated from the barycentric coordinate tess_coord[i] of this vertex on the tessellated triangle.

Some triangles of the third set are already associated with random values, the one generated at step S20. These random values are kept and only the sub-vertices without random value are concerned by steps S200 to S220. Thus one determines sub-vertices $v_i$ of a triangle of the third set without a single random integer. This allows preserving computing resources.

Now, the first and third sets have triangles having an area that is smaller or equal to $S_o$ and with vertices associated with a single random value. The first and third sets can be merged (S40) as the divergent pipeline transformed the divergent triangles into regular triangles.

Referring now to FIG. 2, it is discussed the generation of the VPLs in accordance with a probability law and the way the merged first and third sets are randomly partitioned.

At step S50, the set of triangles (S40) is partitioned into N+2 subsets of triangles according to a probability law, and one of these N+2 subsets is discarded (S510), that is, the triangles are definitively removed.

In practice, the decimation of the triangles at step S510 can be performed before the partitioning so that less computing resources are required for creating the partitions as less triangles have to be analyzed when partitioning.

The triangle decimations aims at removing small triangles of the 3D scene as they contribute poorly to the final rendering for diffuse indirect lighting. A straight forward solution would be to remove small triangles under an area threshold. However, groups of small triangles may collectively have an important impact in the light transport. A stochastic decimation approach is used in which the contribution of heavily tessellated geometry is retained by computing, for each triangle of the first and third set, a uniform random value $u_{ti}$ lying between 0 and 1. The rule is the following: if $\mathcal{A}(t_i) > u_{ti} S_o$, then the triangle is kept (that is, not discarded), and if $\mathcal{A}(t_i) \leq u_{ti} S_o$ then the triangle is added to the set of triangles to be discarded (being understood that the triangle can be immediately discarded).

If one takes the assumption that every triangle can be assumed to be regular, the probability for a triangle $t_i$ to be kept boils down to (equation 2):

$$\forall t_i \in \mathcal{L}_i, P(t_i \in \mathcal{L}^*) = \frac{\mathcal{A}(t_i)}{S_0}$$

where $\mathcal{L}*$ denotes the triangles $t_i$ of the first and third sets (S40) that are kept, and $\mathcal{A}$ denotes the triangles of the first and third sets. Intuitively, this means that the smaller a triangle is, the greater its chance to be discarded becomes. At the same time, this partitioning translates into a uniform distribution of samples over the entire scene surface, such that the kept triangle count expectation is $$\mathbb{E}(N_{sample}) = \frac{\mathcal{A}_{scene}}{S_o}$$

with $\mathcal{L}_{scene}$ that is the total scene area.

Once the triangles have been discarded, or at least associated with a partition to be discarded, the remaining triangles (that is, the triangles that are kept) are dispatched (step S520) in one ($\mathcal{L}^0, \ldots \mathcal{L}^N$) of the N+1 remaining subsets $\mathcal{L}^k$ according to a probability for a triangle to lie in a subset $\mathcal{L}^k$. The dispatch is such that that $\mathcal{L}^N$ contains a few triangles and $\mathcal{L}^k$ is more and more populated when k gets closer to 0. Doing so, a multiscale partitioning of representative scene triangles emerges from the decimation strategy (step S510), with the probability for a triangle to lie in the subset $\mathcal{L}^k$ being (equation 3):

$$P(t_i \in \mathcal{L}^k) = \begin{cases} \frac{\mathcal{A}(t_i)}{S_N}, & \text{if } k = N \\ \frac{\mathcal{A}(t_i)}{S_N} - \frac{\mathcal{A}(t_i)}{S_{k+1}}, & \text{if } 0 \le k < N \end{cases}$$

and (equation 4)

$$S_k = S_o \mu^k$$

where $\mu > 1$ is a user defined real number. With $S_k = S_o \mu^k$, the number of VPLs per subset $\mathcal{L}^k$ evolves exponentially, which mimic a behavior of some existing techniques of the prior art, e.g. those based on tree structures.

The value of μ depends on the scene and the number of partitions. The value μ is typically comprised between 1, 4 and 5. A requirement on acceptable values of μ will be discussed later in a discussion regarding an example of implementation of the method. Indeed, $S_k = S_o \mu^k$ is an implementation choice and may be understood as the average surface of triangles lying in the partition (or subset) $\mathcal{L}^k$. In practice, $S_k$ is chosen so that it value increases when k increases. With the aforementioned formulation (Equation 4), the partitioning induces subsets with a size expectation that decreases geometrically, mimicking the traditional hierarchical representations used with light fields. However, no kind of explicit hierarchy is maintained, generated, or managed because triangles are affected to a certain subset independently from the choice made for any other. In particular, this means that a given triangle, located in a given subset, does not capture any coarse-grained information carried by finer triangles.

The following algorithm 1 shows an example of the generation of a partition such as defined from equation 3, with the probability law $u_{ti}$ kept unchanged.

```
1:   procedure COMPUTELEVEL (u_ti ; ti)
2:       for k←N...1 do
3:           if u_ti < 𝒜(t_i)/S_k then
4:               return k
5:           end if
6:       end for
7:       DISCARDTRIANGLE ( ) fthreshol
```

To evaluate algorithm 1 for each triangle, a pseudo-random value is used for the variable $u_{ti}$. In an example, the generation of this value relies on the additional per-vertex uint32 attribute—v rand. As discussed, this attribute is initialized when loading the mesh (the raw data) with random values uniformly chosen for example between 0 and $2^{32}$. In the regular pipeline, at geometry shading stage, $u_{ti}$ is computed as a xor between the random attributes of the three vertices of a triangle ti. The choice of the xor operator allows avoiding correlation among two or three triangles. Moreover, new random values can be generated at any time by using u_rand that is a global uniform random value that may be updated at most once per frame at the rendering time. Being xor'd with the original per-vertex values, it allows to get whole new random distributions over the mesh. This is apparent in the algorithm 2 below.

For the divergent pipeline (for triangle that are not regular), the construction of $u_{ti}$ is quite more subtle. Indeed, this value remains unaltered, even under camera motion or mesh deformation, i.e. as long as the mesh topology remains the same. To preserve these properties, one performs the tessellation in the model space and exploit the fact that the tessellation pattern only depends on the input triangle shape. Indeed, the tessellation parameters are only determined by the original triangle area, as explained in the discussion regarding steps S200-S220. Thus, to generate $u_{ti}$ for a triangle sprung from the subdivision, a xor is computed between the three v_rand_tess, the three base triangle v_rand and finally the global uniform random value u rand, as show in the algorithm 2:

```
1:   uniform uint32 u rand
2:   uniform texture2D noise
3:   function REGULARRAND(ivec3 v rand)
4:       return u rand xor v rand.x xor v rand.y xor v rand.z
5:   end function
6:   function DIVERGENTRAND(ivec3 v rand, vec2 tess coord[3])
7:       ivec3 v tess rand
8:           v rand tess.x = TEXTURE(noise, tess coord[0])
9:           v rand tess.y = TEXTURE(noise, tess coord[1])
10:          v rand tess.z = TEXTURE(noise, tess coord[2])
11:      return REGULARRAND(v rand xor v tess rand)
12:  end function
```

FIG. 3-(b) and (c) shows the generation of the partitions, that is, the surviving triangles (those that remain after the discard of the "small" triangle (b)) are classified among subsets $\mathcal{L}^0, \ldots \mathcal{L}^k, \ldots \mathcal{L}^N$ according to a probability law $P(t_i) \in \mathcal{L}^k$ of equation 3 with a pseudo-random value used for the variable $u_{ti}$.

Back to FIG. 2, at step S60, a single virtual point light is computed for each triangle of the remaining subsets $\mathcal{L}*$. Preferably, to properly cope with hardware restrictions, no more than one VPL per triangle is computed; being understood some triangles might have more than one VPL, e.g. the decision could be performed according to their $\mathcal{A}(t_i)$. The computation of the VPL for each remaining triangle is performed as known in the art.

The computing of VPLs actually involves the computing of an outgoing radiance for each VPL in order to perform a lighting with the VPLs. As it will apparent with the mathematical discussion set forth below, the computation of the outgoing radiance (step S70) is performed according to the subset in which the triangle has been dispatched. Hence, a radius of influence (that is, an outgoing radiance) is assigned to each triangle of the first and third sets using a probability law, the one of equation 3 used for obtaining the subsets $\mathcal{L}^0, \ldots \mathcal{L}^k, \ldots \mathcal{L}^N$. Therefore, the probability law can be contemplated as a distribution of radius of influence that is performed so that a decreasing density of radius of influence is obtained: indeed, the partitioning induces subsets with a size expectation that decreases geometrically, mimicking the traditional hierarchical representations used with light fields. One understands that the discarding of the triangles with low contribution to the rendering of the 3D scene amounts to obtaining a subset of the initial set (the raw data) of triangles by filtering out the triangles according to their radius of influence.

Step S700 to 710 show an example for computing outgoing radiance for the virtual point light of each triangle of $\mathcal{L}^*$ according to the subset $\mathcal{L}^*$ in which the triangle has been dispatched. A family of nested balls $\mathcal{B}_k(t_i)$ is computed. $\mathcal{B}_h(t_i)$ represent the set of points in the three-dimensional scene for which the contribution of the virtual point lights is significant (S700). A support function $f^k(t_i, x)$ is computed for each remaining N+1 subset, at step S710. The set of support functions $(f^k)_k$ over the remaining subsets form a partition of unity that is constant over a frontier of a $\mathcal{B}_h(t_i)$ of a family of nested balls. For the sake of explanation, the model of outgoing radiance used in this example is now discussed, and the computations of steps S700 and S710 will be performed accordingly. FIG. 3 (f) shows examples of radius of influence with different sizes; the outgoing radiance computed for the virtual point light of a triangle depends on the subset the triangle belongs to.

Figure 6:
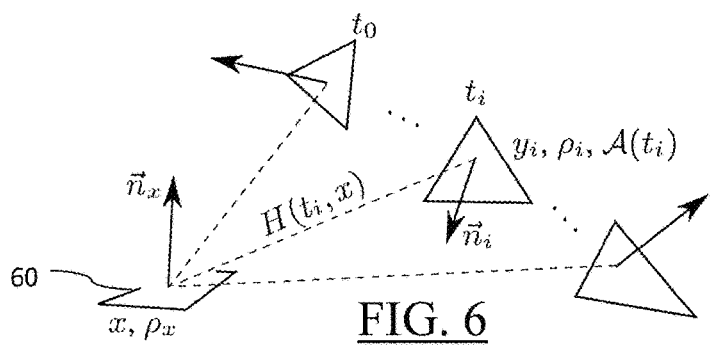
FIG. 6 shows an example of the illumination of a virtual point light at a point x.

The indirect outgoing radiance $L(x, \vec{n}_x)$ of a point x with normal $n_x$ is defined by the equation 5 as $$L(x, \vec{n_x}) = \sum_{t_i \in \mathcal{L}} H(t_i, x, \vec{n_x}) \mathcal{A}(t_i)$$

where $\mathcal{L}$ represents the set of all triangles in the scene (that is the raw data) and $H(t_i, x, \vec{n}_x)$ stands for the incoming radiance transfer function starting from $t_i$ toward the receiver x oriented by $\vec{n}_x$. FIG. 6 shows a pixel 60 (the receiver) with a point x oriented by $\vec{n}_x$ and $\rho_x$ is albedo at point x. For a diffuse receiver with albedo $\rho_x$, this transfer function is defined as (equation 6)

$$H(t_i, x, \vec{n_x}) = L(t_i, \overline{y_i x}) \frac{\rho_x}{\pi} \frac{\langle \vec{n_x}, x\overline{y_i} \rangle^+ \langle \vec{n_i}, \overline{y_i x} \rangle^+}{d_i^2},$$

where $$\overline{u} = \frac{\vec{u}}{\|\vec{u}\|}, \langle \vec{u}, \vec{v} \rangle^+ = \max(0, \langle \vec{u}, \vec{v} \rangle), L(t_i, \overline{y_i x})$$

is the radiance leaving the VPL centered at $y_i \in t_i$ toward the direction $\overline{xy_i}$ and $d_i = \max(\in, \|xy_i\|)$ is the distance between $y_i$ and x clamped to a user parameter $\in$ to avoid singularities. Typically, $\in$ has a value included in the range $[10^{-3}; 10^{-6}]$.

The first diffuse bounce of light can be modeled with the following VPLs outgoing radiance expression (equation 7):

$$L(x, \vec{n_x}) = \frac{E(t_i)\rho i}{\pi} \langle \vec{n_i}, \overline{y_i x} \rangle^+$$

where $E(t_i)$ is the direct irradiance falling to the triangle $t_i$. Note that because of the term $\langle \vec{n}_i, \overline{y_i x} \rangle^+$, reflectors cannot be considered as perfectly lambertian anymore. Although light is therefore preferably reflected in the direction of the geometric normal, experiments show that no noticeable changes appear, while this greatly alleviates upcoming computations as it will be discussed below.

In order to cope with hardware limitation, the computation of $L(x, \vec{n}_x)$ may be approximated by summing the contribution of a subset of VPLs, that is, by summing the contributions of the VPL of triangles of a subset $\mathcal{L}^k$. Thus, an estimator noted $K(x, \vec{n}_x)$ of $L(x, \vec{n}_x)$ can be defined (equation 8)

$$K(x, \vec{n_x}) = \sum_{k=0}^{N} \sum_{t_i \in \mathcal{L}} H(t_i, x, \vec{n_x}) F^k(t_i, x)$$

where $F^k(t_i,x)$ is an unknown function of the position x, the emitter $t_i$ and the index k. Its equation is derived below.

By computing the expectation of $K(x, \vec{n}_x)$ over the set of every possible partition ($\mathcal{L}^0, \ldots \mathcal{L}^k, \ldots \mathcal{L}^N$), one obtains the following equation 9

$$\mathbb{E}[K(x, \vec{n_x})] = \mathbb{E}\left[\sum_{k=0}^{N} \sum_{t_i \in \mathcal{L}^k} H(t_i^k, x, \vec{n_x}) F^k(t_i^k, x)\right]$$

$$= \sum_{t_i \in \mathcal{L}} H(t_i, x, \vec{n_x}) \mathbb{E}\left[\sum_{k=0}^{N} F^k(t_i, x) \mathbb{1}_{[t_i \in \mathcal{L}^k]}\right]$$

$$= \sum_{t_i \in \mathcal{L}} H(t_i, x, \vec{n_x}) \sum_{k=0}^{N} F^k(t_i, x) P(t_i \in \mathcal{L}^k),$$

where $\mathbb{1}_{[t_i \in \mathcal{L}^k]}$ is the indicator function, that equals to 1 if $t_i \in \mathcal{L}^k$ and 0 otherwise.

If one wants $K(x, \vec{n}_x)$ to represent an unbiased estimator of the incoming radiance $L(x, \vec{n}_x)$, it is necessary to verify the following functional equation on the function $F^k$ (equation 10)

$$\forall x, \Sigma_k F^k(t_i, x) P(t_i \in \mathcal{L}^k) = \mathcal{A}(t_i).$$

According to the VPLs partitioning strategy as established in the equation 3, $F^k$ is defined as (equation 11)

$$F^k(t_i, x) = \begin{cases} S_0 \mu^N f^N(t_i, x), & \text{if } k = N \\ S_0 \frac{\mu^{k+1}}{\mu - 1} f^k(t_i, x), & \text{if } 0 \leq k < N \end{cases},$$

Equation 11 allows to rewrite the unbiased condition of equation 10 as a partition of unity problem. The partition of unity is a set of functions from a set X to the unit interval

[0,1] such that for every point, x in X, the sum of all the function values at x is 1. This leads to seeking for a set of functions $(f^k)_k$ such that (equation 12)

$$\forall x, \Sigma_k f^k(t_i,x)=1.$$

Thus, the lighting with VPLs has been approximated using the partitioning of the triangles into subsets ($\mathcal{L}^0, \ldots \mathcal{L}^k, \ldots \mathcal{L}^N$), that is, it has been approximated by use of the probability law used for dispatching the triangles into the N+1 subsets. This approximation also leads to find out a set of functions $(f^k)_k$, each function of the set being a function that supports the incoming radiance of a VPL of a subset. The support of the function is the set of points where the function is not zero-valued. Thus, for each subset ($\mathcal{L}^0, \ldots \mathcal{L}^k, \ldots \mathcal{L}^N$), a support function is computed that depends on the support it belongs to. For instance, the support of the function $f^k$ is $\mathcal{B}_{D_{k+1}}$, as shown in equation 17-18. This means that the support of $f^k$ is one of the function $\mathcal{B}_h$ for a particular h such that $h=D_{k+1}$.

Inspired from PBGI tree cuts strategies discussed in CHRISTENSEN, P. 2008. *Point-based approximate color bleeding*. Pixar Technical Notes 2, 5, 6, a family of nested balls $\mathcal{B}_h(t_i)$ is introduced. The $\mathcal{B}_h(t_i)$ functions are characterized by h>0, and for a given h, $\mathcal{B}_h(t_i)$ represents the set of points for which the contribution of the VPL is significant. Said otherwise, the family of nested balls $\mathcal{B}_h(t_i)$ form a set of volumes in the 3D space, and for each h>0, a single volume $\mathcal{B}_h$ exists. The geometric shape of $\mathcal{B}_h$ is a sphere whose center is constrained to (and passes through) a line($y_i,n_i$), and has a diameter D(h). h is a parameter of $\mathcal{B}_h$. For each point x outside of $\mathcal{B}_h(t_i)$, the transfer function $H(t_i,x,\vec{n}_x)$ (discussed in reference to equations 6, 8, and 9) is smaller than h whatever the orientation of the receiver $\vec{n}_x$. This is expressed in equation 13

$$\forall h \in \mathbb{R}^*, \quad \mathcal{B}_h(t_i) = \left\{ x \in \mathbb{R}^3 \text{ s.t. } \max_{\vec{n}} H(t_i, x, \vec{n}) \geq h \right\}.$$

Furthermore, the transfer function $H(t_i,x,\vec{n}_x)$ (discussed in reference to equations 6, 8, and 9) is maximal when the receiver is front facing the emitter, or said otherwise, $\vec{n}_x = \overline{xy_i}$. Thus, with VPL radiance distribution model, the $\mathcal{B}_h(t_i)$ functions can be written (equation 14):

$$\mathcal{B}_h(t_i) = \left\{ x \in \mathbb{R}^3 \text{ s.t. } \frac{\|x - y_i\|}{\langle \vec{n}_x, \overline{xy_i} \rangle^+} \leq D(h) = \frac{1}{\pi} \sqrt{\frac{\rho_x \rho_i E(t_i)}{h}} \right\},$$

where D(h) (the diameter of the sphere of $\mathcal{B}_h(t_i)$ represents the maximal distance of the contribution of the direct outgoing radiance of a VPL that belongs to a given subset As D(h) does not depends on x, $(\mathcal{B}_h(t_i))_{h \in \mathbb{R}^*}$ is a family of nested balls which frontier owns $y_i$ and center lies on the line ($y_i, n_i$).

The 3D partition of unity $(f^k)_k$ can be constant over the spheres being the frontier of a $\mathcal{B}_h(t_i)$. The $\mathcal{B}_h(t_i)$ function are the isolevel of the support functions. Then, by defining the following mapping from $\mathbb{R}^3$ to $\mathbb{R}$ (equation 15):

$$\forall x \in \mathbb{R}^3, d(t_i, x) = \frac{\|\overline{xy_i}\|^2}{\langle \vec{n}_x, \overline{xy_i} \rangle^+}$$

the 1D partition of unity $(\tilde{f}^k)_k$ that is obtained is defined by (equation 16)

$$\forall x \in \mathbb{R}^3, f^k(t_i,x)=\tilde{f}^k(d(t_i,x)).$$

As partition of unity $(f^k)_k$ will be used for performing a splatting operation, as known in the art. Hence, when the lighting of a VPL is computed for each pixel, an evaluation of each pixel is carried out for blending textures together on each pixel. During rendering, the partition of unity $(\tilde{f}^k)_k$ may be made as smooth as possible while keeping them easy to compute and define them as (equation 17):

$$\forall d \in \mathbb{R}, \quad \tilde{f}^k(d) = \begin{cases} 1 & \text{if } k = 0 \text{ and } d \in ]0;D_1] \\ \frac{d - D_{k-1}}{D_k - D_{k-1}} & \text{if } k > 0 \text{ and } d \in ]D_{k-1}, D_k \\ \frac{D_{k+1} - d}{D_{k+1} - D_k} & \text{if } k > 0 \text{ and } d \in ]D_k, D_{k+1} \\ 0 & \text{otherwise} \end{cases}$$

In addition, it is possible to define (equation 18)

$$\begin{cases} D_k = \sqrt{S_0 \mu^k}, & \forall k \in [0 \ldots N] \\ D_{N+1} = D_N \end{cases}$$

so that a set of continuous piecewise affine functions with compact support is obtained. The so-defined functions are well suited if only if $D_N$ is greater that the diameter of the scene, otherwise they may exists a pair of points in the scene that cannot contribute to light transport. This means that $D_N > R_{scene}$. This translates into the following condition on μ (Eqn. 4):

$$\mu > \sqrt[N]{4 \frac{\mathcal{R}_{scene}^2}{S_o}}.$$

Figure 7:
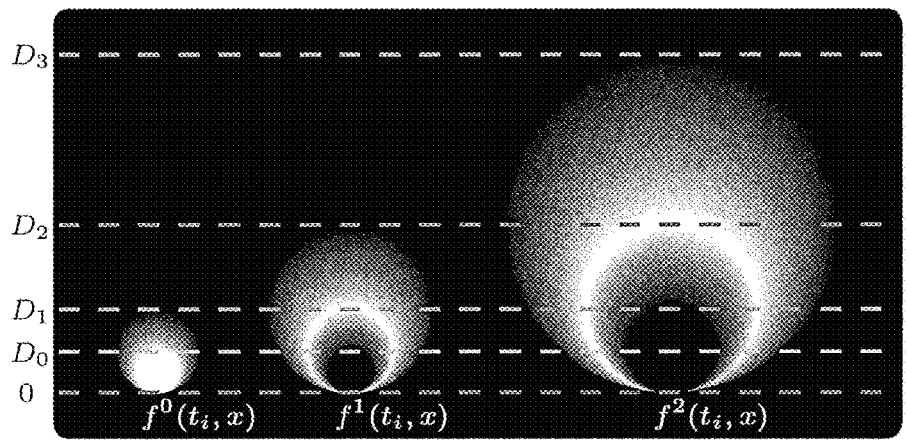
FIG. 7 shows an example of visualization of support functions on a planar section, for values ranging from 0 (black) to 1 (white)

Referring now to FIG. 7, examples of visualization of the support functions $(f^k)_k$ that support the $\mathcal{B}_h(t_i)$ functions on a planar section. The $\mathcal{B}_k(t_i)$ function are the isolevel of the support function and define the contour of the support function. Interestingly, the distance ($D_0, D_1, D_3$) of the contribution of the sphere of ($\mathcal{B}_h(t_i)$) on its support function depends on the subset ($\mathcal{L}^0, \ldots \mathcal{L}^k, \ldots \mathcal{L}^N$) that the power of a VPL depends on the subset it belongs. Hence, when k gets closer to 0, $\mathcal{L}^k$ is more and more populated by triangles (and thus VPL) with less and less power, while when k gets closer to N, $\mathcal{L}^k$ contains less and less triangles (and thus VPLs) with more and more power. As shown on FIG. 3 (*f*), low power VPLs are used to capture local lighting while high power VPLs are used to capture model distant lighting with crescent-shape support functions.

Figure 8:
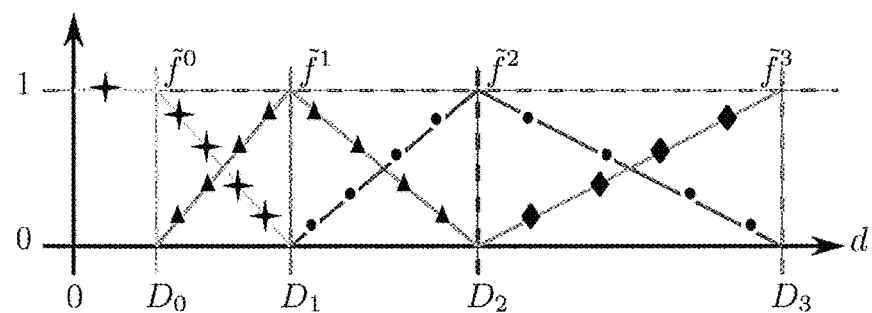
FIG. 8 shows an example of one dimensional partition of unity.

FIG. 8 shows an example of a one dimensional partition of unity that are used for performing a splatting operation at rendering time for rendering a sphere of a $\mathcal{B}_h(t_i)$. The smoother is the function, the better are the computation results. The example of $\tilde{f}^k$ of FIG. 8 has good results as there are a limited numbers of overlaps (on the abscissa there are at the most two functions that are not zero-valued), the function is continuous and concave. $\tilde{f}^0$ is represented by the curve with the stars, $\tilde{f}^1$ with the triangles, $\tilde{f}^2$ with the dots, and $\tilde{f}^3$ with the diamonds on it. Several classes of functions can be used. In particular, a good base function of the set of support functions $(f^k)_k$ is a B-spline.

Finally, at step S80, the three-dimensional scene is rendered by lighting its set of triangles, the triangle of the subset of triangles $\mathcal{L}^*$ being used as indirect light sources according to their radius of influence. As mentioned, the support functions $(f^k)_k$ are used for carrying out splatting function for rendering the spheres of the $\mathcal{B}_h(t_i)$ functions of the family of nested balls. The rendering is performed as known in the art and uses the one or more direct light sources provided with the 3D scene for exploiting the computed VPLs.

Figure 10:
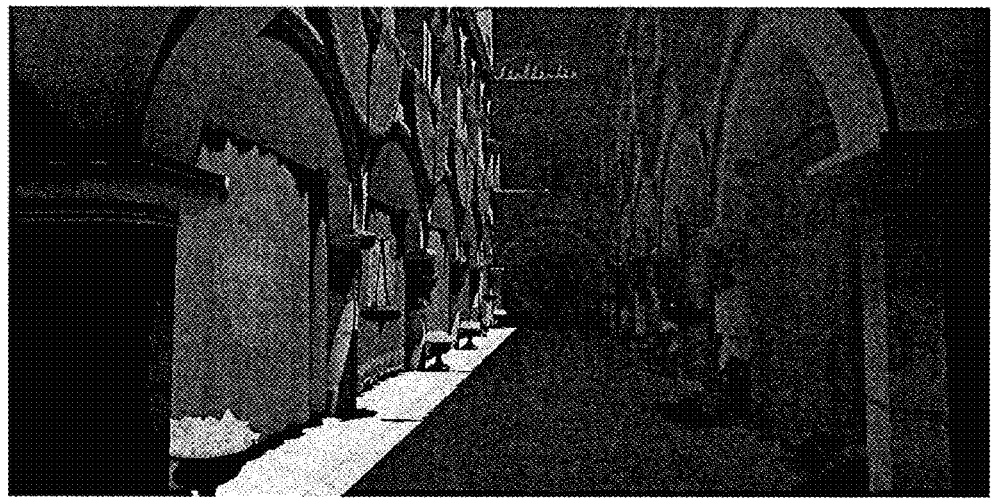
FIGS. 10 and 11 are screenshots showing examples of illuminations of a same scene without and with the divergent pipeline of the invention.
Figure 11:
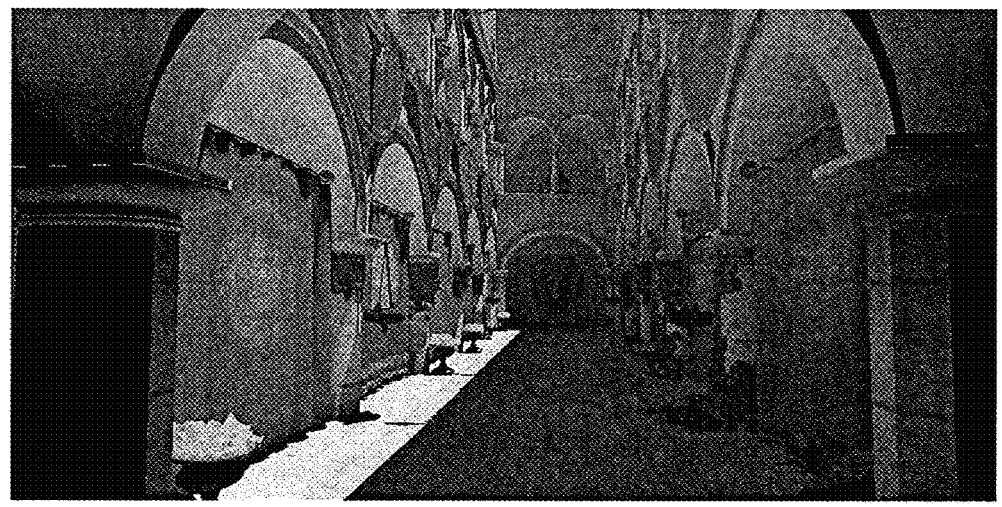

FIGS. 10 and 11 are pictures (screenshots) of a 3D scene rendered with a global illumination. FIG. 10 shows the scene rendered without the divergent pipeline: only the heavy tessellated geometry cast indirect lighting. FIG. 11 shows the same 3D scene that is rendered by using the divergent pipeline; the ground (which is comprised of 4 triangles) light bounce reveals much of the scene. Hence, the biggest triangles are those used that are in the subset(s) that is(are) the closer of $\mathcal{L}^N$ and that are used to model distant lighting.

Figure 4:
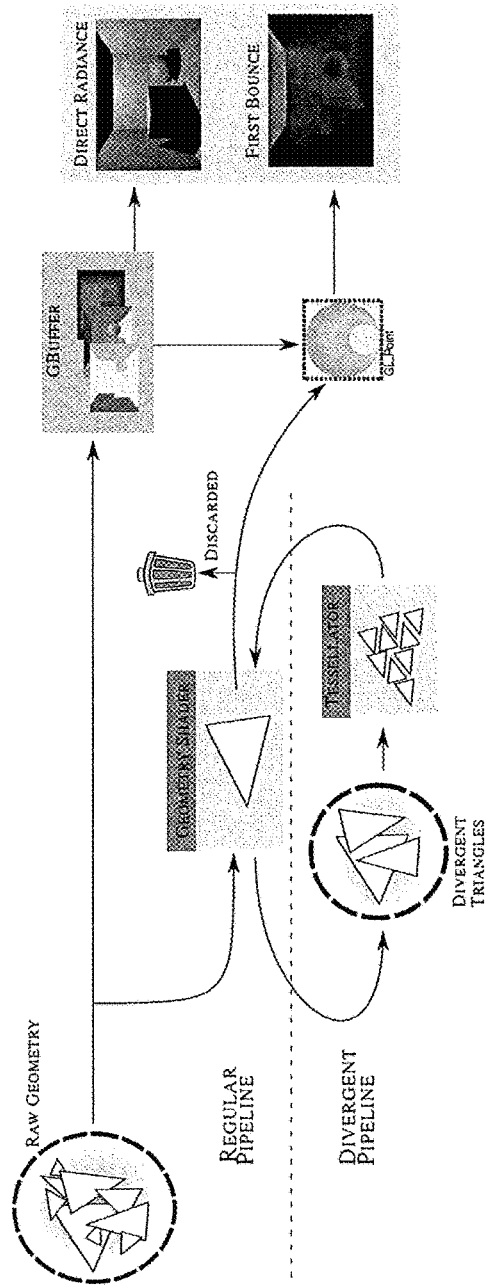
FIG. 4 shows an example of indirect illumination shader pipelines of the invention.

For the sake of completeness, implementation details are discussed in reference to FIG. 4. The pipeline only contains two geometry draw passes of the entire scene: one to generate the GBuffer and one to generate and splat the VPLs. These are the regular pipelines. This moderate use of the raw geometry is an important metric for application that require huge number numbers of polygons, for instance Computer-Aided Design (CAD) and the like software application. A typical CAD scene comprises thousands of 3D modeled objects in which each object comprises hundreds or thousands of triangles, and even more. In fact, a third geometry draw pass occurs, but involves only a fraction of the scene: the divergent triangles that are processed by the divergent pipeline. As the divergence criterion is set such that the number of divergent triangles remains small, this last pass is not computationally prohibitive. Indeed, the regular pipeline exploits intensively the geometry shader stage to perform computations on a per-triangle basis rather than a per-fragment or a per-vertex one. Interestingly, for recent GPU architecture, the formally prohibitive overhead of the geometry shader stage has been greatly reduced, enabling polygon-wise computations for large streams.

The divergent pipeline exploits hardware tessellation units are not designed to manage massive triangle sets as input, inducing a noticeable overhead while processing a triangle even if this triangle does not require any subdivision. At the same time, the geometry stage of these architectures are extremely efficient at discarding or letting passing through polygons, i.e. when no geometry amplification is mandatory. In the first pass of the regular pipeline the entire scene geometry (raw data) is processed but the tessellation stage is disabled. Divergent triangles (S320) are detected at the geometry stage and stored in a separate buffer, while regular ones are stochastically sampled (S520). In order to manage scenes with numerous materials and textures, a per-triangle material index may be stored, used in the following pass to fetch information from a material or texture atlas.

Graphic library provides features that allow optimizing rendering computations. For instance, using the OpenGL "glDrawArrayIndirect" feature, the divergent buffer on which non-regular triangles are stored is subsequently directly used as input geometry for the second pass without any CPU synchronization. The tessellation stage is solely activated for this particular pass and used to subdivide (S322) the triangles such that their area becomes small enough to be processed by our regular pipeline. In general, the number of large triangles is relatively small compared to the total triangle count. Consequently, the overhead induced by the divergent buffer filling and vertex processing is negligible.

The VPL support functions $(f^k)_k$ can be made as smooth as possible; this allows producing at each frame a visually plausible rendering without high frequency artifacts. Nevertheless, with the aforementioned global uniform variable u_rand, it is straightforward to generate many independent renderings of the same scene. In addition, for each triangle, one can easily derive two new independent random values from u_rand. These values are used to jitter the VPL center $y_i$ defined in equation 6 over the triangle $t_i$.

Then, by averaging all these renderings with jittered VPLs, equation 9 provides a result that is allows the computation of the first bounce outgoing radiance on surface composed of diffuse reflectors and ignoring indirect visibility. While this means that indirect lighting is computed by integrating over every scene triangle, this progressive version of the present method is able to manage any kind of disturbed geometry (e.g. normal mapping, alpha tested) and could also be extended to manage emissive textured geometry.

The way the VPL contributions are summed to simulate the indirect lighting is orthogonal to previous discussion. Hence, to keep a simple pipeline, a splatting strategy similar to deferred lighting discussed in SAITO, T., AND TAKAHASHI, T. 1990. *Comprehensible rendering of 3-d shapes. In ACM SIGGRAPH Computer Graphics*, vol. 24, ACM, 197-206 may be used. In particular, this allows to manage geometry decimation, VPLs generation and lighting in a single shader program. Indeed, besides determining whether a triangle is divergent or not and which is the level of generated VPLs, the geometry shader can be used to transform input triangles in sized point primitives which encompasses the underlying VPL screen space function support. Undersampling the resulting signal may be a good optimization. To do so, the viewport is partitioned in $4^{Ntiling\ level}$ tiles and assign to each pixel in the viewport a unique tile pixel at the same relative location—this technique is often referred as interleaved sampling (KELLER, A., AND HEIDRICH, W. 2001. *Interleaved sampling*. Springer.). Next, at splatting time, a tile is randomly chosen for each VPL thus dividing the number of touched pixels by $4^{Ntiling\ level}$. The image is recomposed by untiling the buffer and blurring it to remove the generated noise.

The invention claimed is:

1. A computer-implemented method for rendering the global illumination of a three-dimensional scene, comprising:
    providing a three-dimensional scene that comprises of a set $\mathcal{L}$ of triangles and one or more direct light sources;
    determining that each triangle $t_i$ of the set has an area that is below a threshold $S_0$;
    assigning to each triangle of the set a radius of influence using a probability law P;
    obtaining a subset of triangles $\mathcal{L}^*$ by filtering out the triangles according to their radius of influence, where triangles are discarded stochastically with the probability for a triangle $t_i$ to be retained being proportional to a surface area $A(t_i)$ of the triangle $t_i$;
    dispatching the remaining triangles of $\mathcal{L}^*$ in one or more subsets $\mathcal{L}^k$ according to a probability for a triangle to lie in a subset $\mathcal{L}^k$ defined by:

$$P(t_i \in \mathcal{L}^k) = \begin{cases} \dfrac{\mathcal{A}(t_i)}{S_N}, & \text{if } k = N \\ \dfrac{\mathcal{A}(t_i)}{S_k} - \dfrac{\mathcal{A}(t_i)}{S_{k+1}}, & \text{if } 0 \le k < N \end{cases}$$

the value of $S_k$ increasing for when k increases;
rendering the three-dimensional scene by lighting its set of triangles $\mathcal{L}$, wherein each triangle of the subset of triangles $\mathcal{L}^*$ is used to generate one or more virtual point light according to its radius of influence which is used as an indirect light sotwce for lighting the triangles $\mathcal{L}$ being used as indirect light sources according to their radius of influence.

2. The computer-implemented method of claim 1, wherein determining that each triangle of the set has an area that is below the threshold comprises:
partitioning the set of triangles $\mathcal{L}$ into:
a first set of triangles, wherein each triangle of the first set has an area that is below the threshold,
a second set of triangles, wherein each triangle of the second set has an area that is above the threshold, and
tessellating each triangle of the second set into a third set of triangles, wherein each triangle of the third set has an area that is below the threshold as a result of the tessellation,
wherein assigning to each triangle of the set a radius of influence using the probability law P comprises assigning to each triangle of the first and the third sets a radius of influence using the probability law P; and
wherein obtaining a subset of triangles comprises obtaining a subset of triangles by filtering out the triangles of the first and third sets according to their radius of influence.

3. The computer-implemented method of claim 1, further comprising, after determining that each triangle of the set has an area that is below a threshold:
randomly partitioning the set of triangles into N+2 subsets of triangles according to the probability law P;
discarding one of the N+2 subsets of triangles that comprises triangles that are determined as having a low contribution to the rendering of the three-dimensional scene, the remaining N+1 subsets $\mathcal{L}^*$ comprising non-discarded triangles.

4. The computer-implemented method of claim 1, wherein $S_k$ is set such that $S_k = S_o \mu^k$, where $\mu > 1$ and the value of $\mu$ is a real number comprised between [1;5].

5. The computer-implemented method of claim 1, wherein $S_k$ is set such that $S_k = S_o \mu^k$, where the value of $\mu$ is defined by $$\mu > \sqrt[N]{4 \dfrac{\mathcal{R}_{scene}^2}{S_o}}$$

with $\mathcal{L}_{scene}$ that is the radius of the three-dimensional scene.

6. The computer-implemented method of claim 1, further comprising, after that each triangle of the remaining subsets $\mathcal{L}^*$ has been dispatched:
computing a single virtual point light for each triangle of the remaining subsets $\mathcal{L}^*$;
and wherein assigning to each triangle of the set a radius of influence using the probability law P further comprises:

computing an outgoing radiance for the virtual point light of each triangle of the remaining subsets $\mathcal{L}^*$, the computation being performed according to the subset in which the triangle has been dispatched.

7. The computer-implemented method of claim 6, wherein computing an outgoing radiance for the virtual point light of each triangle comprises:
computing a family of nested balls $\mathcal{L}_h(t_i)$ representing the set of points in the three-dimensional scene for which the contribution of the virtual point lights is significant;
computing, for each remaining subset of the N+2 subsets, a support function $f^k(t_i, x)$ such that the set of support functions $(f^k)_k$ over the remaining subsets form a partition of unity that is constant over a frontier of a $\mathcal{L}_h(t_i)$ of the family of nested balls.

8. The computer-implemented method of claim 7, wherein a base function of the set of support functions $(f^k)_k$ is a B-spline.

9. The computer-implemented method of claim 7, wherein $\mathcal{L}_h(t_i)$ is defined by $$\mathcal{B}_h(t_i) = \left\{ x \in \mathbb{R}^3 \text{ s.t.} \dfrac{\|x - y_i\|}{\langle \vec{n_x}, \overline{xy_i} \rangle^+} \le D(h) = \dfrac{1}{\pi} \sqrt{\dfrac{\rho_x \rho_i E(t_i)}{h}} \right\},$$

wherein x is a point of the three-dimensional scene with normal $\vec{n_x}$,
$y_i$ is the point on which the virtual point light is centered on the triangle $t_i$,
$\rho_x$ is albedo at point x,
$\rho_i$ is albedo at point $y_i$,
$E(t_i)$ is a direct irradiance falling to the triangle $t_i$.

10. The computer-implemented method of claim 7, wherein, at the rendering step, the set of support functions $(f^k)^k$ is used for carrying out splatting operations when rendering a sphere of a $\mathcal{L}_h(t_i)$ of a family of nested balls.

11. The computer-implemented method of claim 1, wherein the threshold $S_o$ is defined by $$S_o = 4\pi \dfrac{D_{near}^2}{N_{Avg}},$$

wherein $N_{Avg}$ is an average number of virtual point lights;
$D_{near}$ is a minimal distance between pixels of the 3D scene and VPLs.

12. The computer-implemented method of claim 1, further comprising, before determining that each triangle $t_i$ of the set has an area that is below a threshold $S_o$:
generating (S20) a single random integer for each vertex of triangle $t_i$ of the set.

13. The computer-implemented method of claim 12,
wherein determining that each triangle of the set has an area that is below the threshold comprises:
partitioning the set of triangles $\mathcal{L}$ into:
a first set of triangles, wherein each triangle of the first set has an area that is below the threshold,
a second set of triangles, wherein each triangle of the second set has an area that is above the threshold, and
tessellating each triangle of the second set into a third set of triangles, wherein each triangle of the third set has an area that is below the threshold as a result of the tessellation, wherein assigning to each triangle of the set a radius of influence using the probability law P comprises assigning to each triangle of the first and the third sets a radius of influence using the probability law P;

wherein obtaining a subset of triangles comprises obtaining a subset of triangles by filtering out the triangles of the first and third sets according to their radius of influence; and wherein computing a single random integer for each vertex of triangle further comprises:
for each sub-vertex of a triangle of the third set, determining a barycentric coordinate of the sub-vertex;
using the barycentric coordinate to fetch a random value in a noise texture;
using the fetched random value to generate the single random integer of the said each sub-vertex of a triangle of the third set.

14. A non-transitory computer readable storage medium having recorded thereon a graphic library computer program comprising instructions for performing a computer-implemented method for rendering the global illumination of a three-dimensional scene, the method comprising:
providing a three-dimensional scene that comprises of a set $\mathcal{L}$ of triangles and one or more direct light sources;
determining that each triangle $t_i$ of the set has an area that is below a threshold $S_o$;
assigning to each triangle of the set a radius of influence using a probability law P;
obtaining a subset of triangles $\mathcal{L}^*$ by filtering out the triangles according to their radius of influence, where triangles are discarded stochastically with the probability for a triangle $t_i$ to be retained being proportional to a surface area $A(t_i)$ of the triangle $t_i$;
dispatching the remaining triangles of $\mathcal{L}^*$ in one or more subsets $\mathcal{L}^k$ according to a probability for a triangle to lie in a subset $\mathcal{L}^k$ defined by:

$$P(t_i \in \mathcal{L}^k) = \begin{cases} \dfrac{\mathcal{A}(t_i)}{S_N}, & \text{if } k = N \\ \dfrac{\mathcal{A}(t_i)}{S_k} - \dfrac{\mathcal{A}(t_i)}{S_{k+1}} & \text{if } 0 \le k < N \end{cases}$$

the value of $S_k$ increasing for when k increases;
rendering the three-dimensional scene by lighting its set of triangles $\mathcal{L}$, wherein each triangle of the subset of triangles $\mathcal{L}^*$ is used to generate one or more virtual point light according to its radius of influence which is used as an indirect light source for lighting the triangles $\mathcal{L}$ being used as indirect light sources according to their radius of influence.

15. The non-transitory computer readable storage medium claim 14, wherein determining that each triangle of the set has an area that is below the threshold comprises:
partitioning the set of triangles $\mathcal{L}$ into:
a first set of triangles, wherein each triangle of the first set has an area that is below the threshold:
a second set of triangles, wherein each triangle of the second set has an area that is above the threshold; and
tessellating each triangle of the second set into a third set of triangles, wherein each triangle of the third set has an area that is below the threshold as a result of the tessellation;

and wherein
assigning to each triangle of the set a radius of influence using the probability law comprises assigning to each triangle of the first and the third sets a radius of influence using the probability law; and
obtaining a subset of triangles comprises obtaining a subset of triangles by filtering out the triangles of the first and third sets according to their radius of influence.

16. A computer system for rendering the global illumination of a three-dimensional scene, comprising:
processing circuitry communicatively coupled to a memory;
a graphic card with a graphic processing unit; and
a display,
wherein the memory stores a program that when executed by the processing circuitry causes the processing circuitry to be configured to:
provide a three-dimensional scene that comprises of a set $\mathcal{L}$ of triangles and one or more direct light sources;
determine that each triangle $t_i$ of the set has an area that is below a threshold $S_o$;
assign to each triangle of the set a radius of influence using a probability law P;
obtain a subset of triangles $\mathcal{L}^*$ by filtering out the triangles according to their radius of influence, where triangles are discarded stochastically with the probability for a triangle $t_i$ to be retained being proportional to a surface area $A(t_i)$ of the triangle $t_i$;
dispatch the remaining triangles of $\mathcal{L}^*$ in one or more subsets $\mathcal{L}^k$ according to a probability for a triangle to lie in a subset $\mathcal{L}^k$ defined by:

$$P(t_i \in \mathcal{L}^k) = \begin{cases} \dfrac{\mathcal{A}(t_i)}{S_N}, & \text{if } k = N \\ \dfrac{\mathcal{A}(t_i)}{S_k} - \dfrac{\mathcal{A}(t_i)}{S_{k+1}} & \text{if } 0 \le k < N \end{cases}$$

the value of $S_k$ increasing for when k increases;
render the three-dimensional scene by lighting its set of triangles $\mathcal{L}$, wherein each triangle of the subset of triangles $\mathcal{L}^*$ is used to generate one or more virtual point light according to its radius of influence which is used as an indirect light source for lighting the triangles $\mathcal{L}$ being used as indirect light sources according to their radius of influence.

17. The computer system of claim 16, wherein the graphic card comprises:
geometry shader circuitry configured to determine that each triangle $t_i$ of the set has an area that is below a threshold $S_o$; and
tessellation circuitry configured to tessellate triangles $t_i$ of the set;
and wherein the program stored on the memory further causes the tessellation circuitry of the graphic card to be configured to:
before determining that each triangle $t_i$ of the set has an area that is below a threshold $S_o$, generating a single random integer for each vertex of triangle $t_i$ of the set.

18. The computer system of claim 17, wherein determining that each triangle of the set has an area that is below the threshold comprises:
partitioning the set of triangles $\mathcal{L}$ into:
a first set of triangles, wherein each triangle of the first set has an area that is below the threshold;

a second set of triangles, wherein each triangle of the second set has an area that is above the threshold; and tessellating each triangle of the second set into a third set of triangles, wherein each triangle of the third set has an area that is below the threshold as a result of the tessellation;

wherein assigning to each triangle of the set a radius of influence using the probability law P comprises assigning to each triangle of the first and the third sets a radius of influence using the probability law P; and obtaining a subset of triangles comprises obtaining a subset of triangles by filtering out the triangles of the first and third sets according to their radius of influence, and wherein computing a single random integer for each vertex of triangle further comprises:

for each sub-vertex of a triangle of the third set, determining a barycentric coordinate of the sub-vertex;

using the barycentric coordinate to fetch a random value in a noise texture;

using the fetched random value to generate the single random integer of the said each sub-vertex of a triangle of the third set.

* * * * *